United States Patent [19]

Ichiguchi

[11] Patent Number: 5,666,313
[45] Date of Patent: Sep. 9, 1997

[54] SEMICONDUCTOR MEMORY DEVICE WITH COMPLETE INHIBITION OF BOOSTING OF WORD LINE DRIVE SIGNAL AND METHOD THEREOF

[75] Inventor: Tetsuichiro Ichiguchi, Hyogo-ken, Japan

[73] Assignee: Mitsubishi Denki Kabushiki Kaisha, Tokyo, Japan

[21] Appl. No.: 707,364

[22] Filed: Sep. 4, 1996

Related U.S. Application Data

[63] Continuation of Ser. No. 921,168, Jul. 29, 1992, abandoned.

[30] Foreign Application Priority Data

Nov. 29, 1991 [JP] Japan ..................... 3-316978

[51] Int. Cl.$^6$ ........................................ G11C 7/00
[52] U.S. Cl. ................ 365/195; 365/189.09; 365/226; 365/230.06; 327/142; 327/143
[58] Field of Search .................. 365/189.09, 189.11, 365/204, 226, 230.06, 195; 307/272.3, 296.3, 482, 578; 327/142, 143

[56] References Cited

U.S. PATENT DOCUMENTS

| | | | |
|---|---|---|---|
| 4,321,489 | 3/1982 | Higuchi et al. | 365/226 |
| 4,649,523 | 3/1987 | Holder, Jr. et al. | 365/203 |
| 4,964,084 | 10/1990 | Jung et al. | 365/226 |
| 5,073,731 | 12/1991 | Oh | 365/230.06 |
| 5,077,518 | 12/1991 | Han | 365/226 |
| 5,222,042 | 6/1993 | Ichiguchi | 365/189.01 |

*Primary Examiner*—David C. Nelms
*Assistant Examiner*—Andrew Q. Tran
*Attorney, Agent, or Firm*—Lowe, Price, LeBlanc & Becker

[57] ABSTRACT

A word line drive signal generating circuit, which generates a word line drive signal RX to a selected word line, includes an RX generating circuit responsive to an external row address strobe signal *RAS (or/RAS) for generating word line drive signal RX, a determination circuit responsive to an operating power supply voltage level or an externally applied signal for determining whether the word line drive signal RX should be boosted up, and a boosting circuit responsive to the word line drive signal RX and an output of determination circuit for boosting up the word line drive signal RX. The word line drive signal RX is boosted up to or above the operating power supply voltage level only when the determination circuit determines it to be necessary. Thereby, a high voltage is not normally applied to the word line, so that deterioration of breakdown voltage of the word line is prevented, and the reliability of the word line is improved.

2 Claims, 11 Drawing Sheets

PRIOR ART

FIG.4 (a) *RAS
FIG.4 (b) RX
FIG.4 (c) /φSP
FIG.4 (d) φSN
FIG.4 (e) φPR
FIG.4 (f) BL //BL

FIG.7(a) *RAS
FIG.7(b) RXT
FIG.7(c) RX
FIG.8
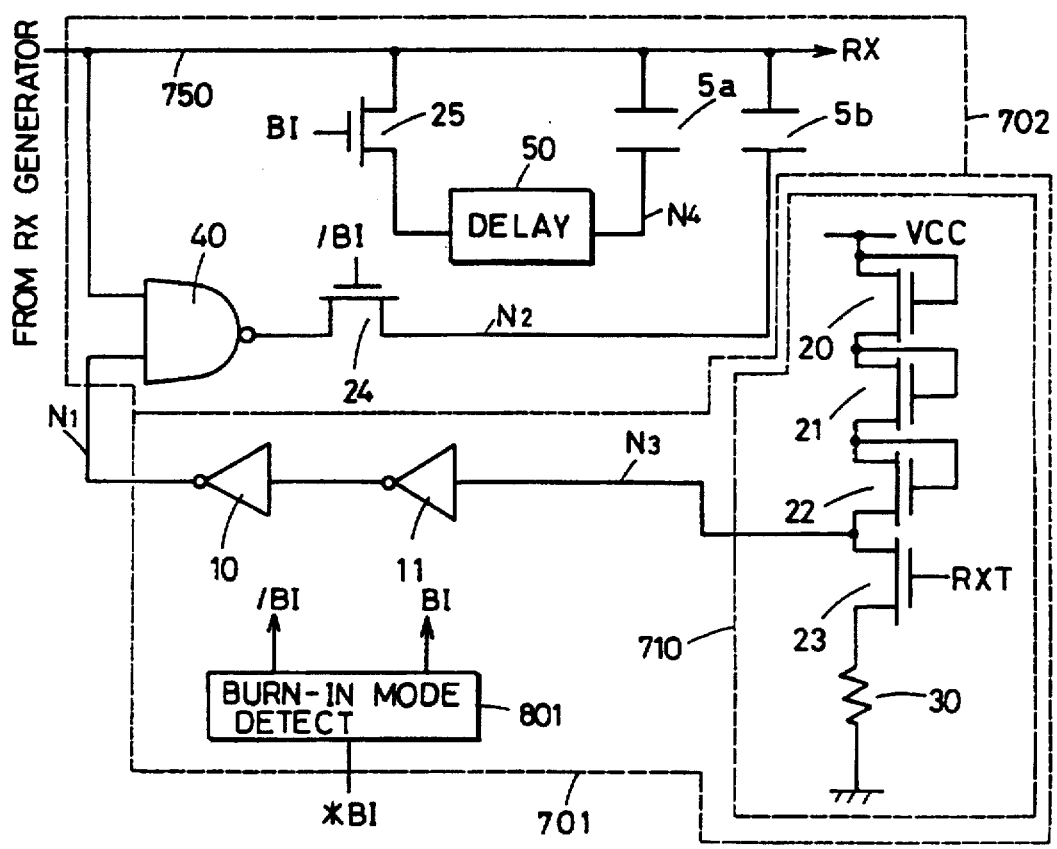

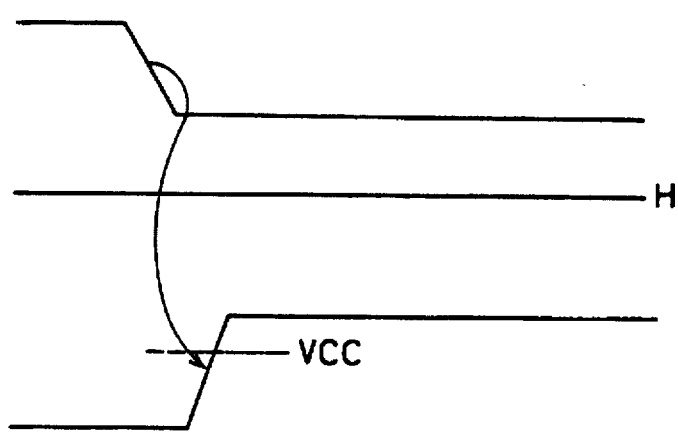
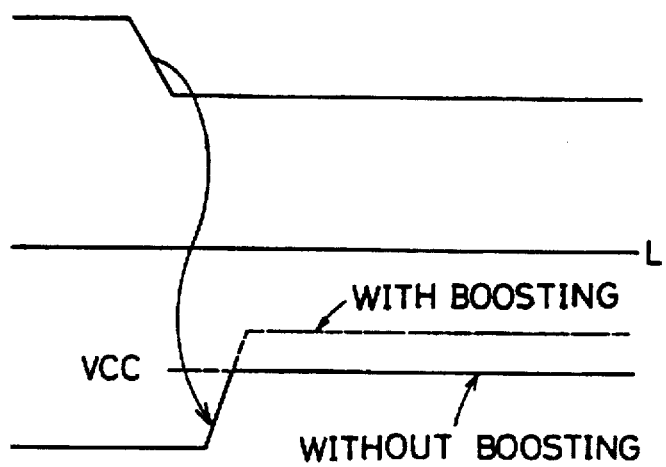

FIG.10(a) *RAS
FIG.10(b) RX
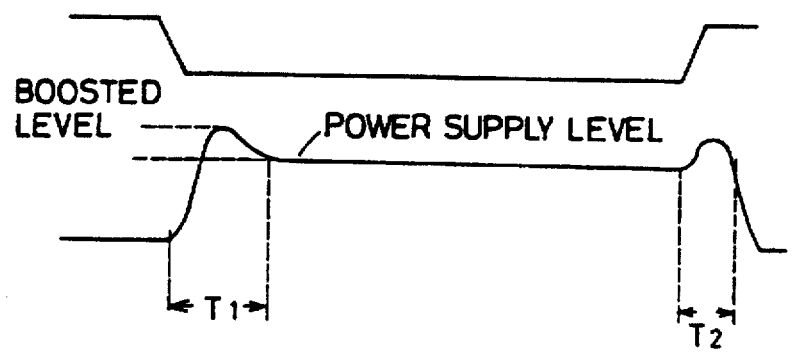
FIG.11
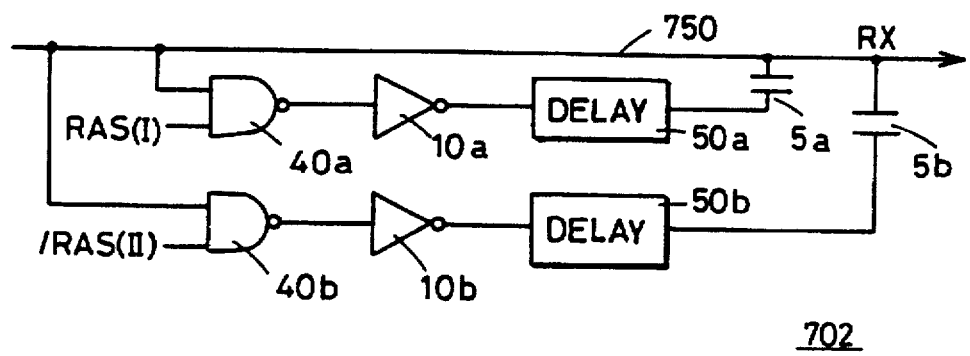

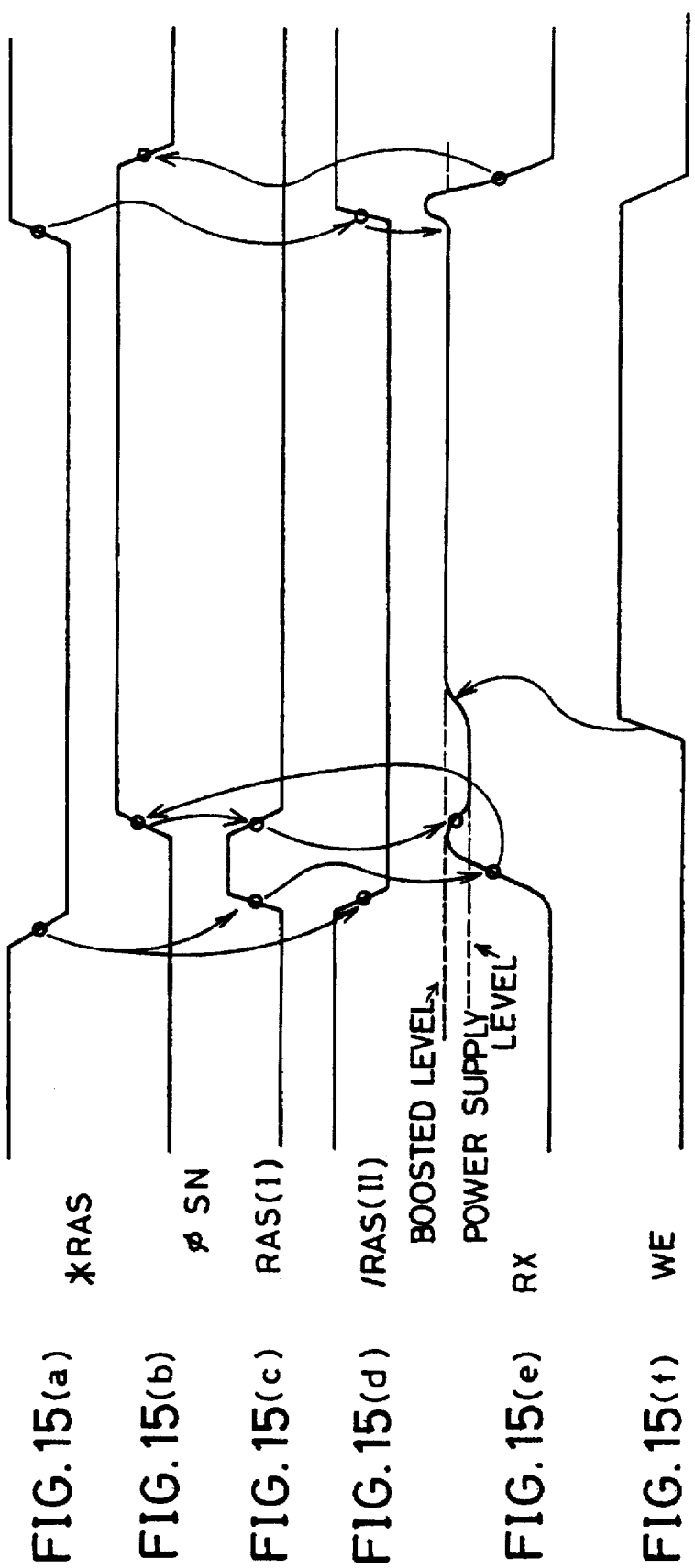

SEMICONDUCTOR MEMORY DEVICE WITH COMPLETE INHIBITION OF BOOSTING OF WORD LINE DRIVE SIGNAL AND METHOD THEREOF

This application is a continuation of Application Ser. No. 07/921,168 filed Jul. 29, 1992, now abandoned.

BACKGROUND OF THE INVENTION

1. Field of the Invention

The present invention relates to a semiconductor memory device and a driving method of the same, and particularly, to a construction of a circuit generating a word line drive signal to be transmitted to a selected word line.

2. Description of the Background Art

FIG. 1 schematically shows an overall construction of a dynamic semiconductor memory device in the prior art. In FIG. 1, the dynamic semiconductor memory device 500 includes a memory cell array 501 having dynamic memory cells arranged in a matrix of rows and columns, an address buffer 502 which receives externally applied address signals A0–An and generates internal address signals, a row address decoder 503 which decodes the internal row address signals supplied from address buffer 502 and selects a corresponding row in memory cell array 501, and a word driver 504 which is responsive to an output of row address decoder 503 to raise the potential of the word line disposed in the selected row.

Word river 504 transmits a word line drive signal, which is supplied from a word line drive signal generating circuit 505, to the word line corresponding to the row selected by row address decoder 503.

Semiconductor memory device 500 further includes a column address decoder 506 which decodes an internal column address signal supplied from address buffer 502 and selects a corresponding column in memory cell array 501, a sense amplifier which detects and amplifies data of memory cells in the selected row in memory cell array 501, and an IO gate which connects the column selected by column address decoder 506 to an I/O circuit 508. In FIG. 1, the sense amplifier and the I0 gate are represented by one block 507.

Semiconductor memory device 500 further includes a clock buffer 509 which generates an internal control signal in response to externally applied control signals *RAS (row address strobe signal), *CAS (column address strobe signal) and *WE (write enable signal), and a word line drive signal generating circuit 505 which generates the word line drive signal in response to an internal row address strobe signal /RAS supplied from clock buffer 509. Word line drive signal generating circuit 505 includes an RX generating circuit 511 which is responsive to an internal row address strobe signal /RAS to generate a word line drive signal RX at a power supply level, and a boosting circuit 522 which boosts up a signal generated by RX generating circuit 511. Drive signal boosted by boosting circuit 522 is transferred through word driver 504 to the selected word line (selected row).

In the data write operation, I/O circuit 508 produces internal write data from external write data D/Q, and transfers the same to block 507. In the data read operation, I/O circuit 508 produces external read data D/Q in accordance with the internal read data read through block 507. I/O circuit 508 may have a construction, in which input buffer for writing the data and an output buffer for reading the data are independent from each other, and are connected to different pin terminals, respectively. These input buffer and output buffer may be connected to the same pin terminal.

Address buffer 502 is responsive to internal control signal (/RAS and /CAS) supplied from clock buffer 509 to generate the internal row address signal and the internal column address signal. Row address decoder 503 and column address decoder 506 are responsive to internal control signals /RAS and /CAS, respectively, to decode the internal address signals applied thereto. Address buffer 502 receives, as address signal A0–An, the row address signal and the column address signal in a time division multiplexing manner. Alternatively, address buffer 502 may simultaneously receives the row address signal and the column address signal, and clock buffer 509 may receive a chip selecting signal *CS, which determines a timing of strobing an address signal of address buffer 502.

I/O circuit 508 is responsive to an internal write control signal/WE supplied from clock buffer 509 to produce the internal write data or external read data.

The semiconductor memory device further includes a sense amplifier drive circuit 510 which drives a sense amplifier included in block 507 in response to internal row address strobe signal/RAS. Sense amplifier drive circuit 510 is responsive to internal row address strobe signal /RAS to drive the sense amplifier included in sense amplifier/IO gate block 507.

FIG. 2 shows a specific construction of memory cell array 501 and sense amplifier/IO gate block 507 shown in FIG. 1. Memory cell array 501 includes a plurality of bit line pairs, each of which is connected to the memory cells on one column, and a plurality of word lines, each of which is connected to the memory cells on one row. FIG. 2 representatively shows a pair of bit lines BL and /BL and two word lines WL1 and WL2.

In FIG. 2, memory cell array 501 includes a memory cell MC1 disposed at the crossing of bit line BL and word line WL1, a memory cell MC2 disposed at the crossing of bit line /BL and word line WL2, and a precharging/equalizing circuit PE which is responsive to a precharging/equalizing signal φPR to equalize and precharge potentials of bit lines BL and /BL to be a predetermined potential VBL.

Memory cell MC1 includes a capacitor C1 storing information and an n-channel MOS transistor (insulated gate type field effect transistor) NT4 which is responsive to the signal potential on word line WL1 to electrically connect capacitor C1 to bit line BL. Capacitor C1 has one electrode (storage node) connected to a drain of transistor NT4 and the other electrode (cell plate) connected to a predetermined potential VG.

Memory cell MC2 includes a capacitor C2 for storing information, and an n-channel MOS transistor NT5 which is responsive to the signal potential on word line WL2 to electrically connect capacitor C2 to bit line /BL.

Precharging/equalizing circuit PE includes an n-channel MOS transistor NT1 which is responsive to a precharging/equalizing signal φPR to transfer predetermined precharge potential VBL to bit line BL, an n-channel MOS transistor NT3 which is responsive to precharging/equalizing signal φPR to transfer precharge potential VBL to bit line /BL, and an n-channel MOS transistor NT2, which is responsive to precharging/equalizing signal φPR to electrically connect bit line BL and bit line /BL.

Sense amplifier/IO gate block 507 includes a p-channel sense amplifier PSA which charges the potential of bit line BL or /BL having a higher potential to a high level of the operating power supply potential VCC level, an n-channel sense amplifier NSA which discharges the potential of bit line BL or /BL having a lower potential to the ground potential, and n-channel MOS transistors NT8 and NT9 which are responsive to a column selecting signal Yi from the column address decoder to connect bit lines BL and /BL to internal data lines DB and /DB. Transistors NT8 and NT9 provide an IO gate IOG.

P-channel sense amplifier PSA includes cross-coupled p-channel MOS transistors PT1 and PT2. Transistor PT1 has a drain connected to bit line BL and a gate of transistor PT2, a gate connected to bit line/BL and a drain of transistor PT2, and a source connected to a signal line 550. Transistor PT2 has the gate connected to the drain of transistor PT1 and bit line BL, the drain connected to the gate of transistor PT1 and bit line/BL, and a source connected to signal line 550.

N-channel sense amplifier NSA includes n-channel MOS transistors NT6 and NT7, of which gates and drains are cross-coupled. Transistor NT6 has the drain connected to bit line BL, a source connected to a signal line 551, and the gate connected to bit line /BL. Transistor NT7 has the gate connected to bit line BL, the drain connected to bit line /BL and a source connected to signal line 551.

Sense amplifier drive circuit 510 includes a sense amplifier activation signal generating circuit 522 which is responsive to internal row address strobe signal /RAS supplied from clock buffer 509 to produce sense amplifier activation signals /$\phi$SP and $\phi$SN, and a sense amplifier activating circuit 514 which is responsive to sense amplifier activation signals /$\phi$SP and $\phi$SN to activate sense amplifiers PSA and NSA. Sense amplifier activating circuit 514 includes a p-channel MOS transistor PT3 which is responsive to sense amplifier activation signal /$\phi$SP to charge signal line 550 up to operating power supply potential VCC, and an n-channel MOS transistor NT10 which is responsive to sense amplifier activation signal $\phi$SN to connect signal line 551 to the ground potential.

FIG. 3 shows a construction of circuitry for a word line drive. In FIG. 3, clock buffer 509 includes an RAS buffer 609 which receives an externally applied row address strobe signal *RAS and generates an internal row address strobe signal /RAS. RAS buffer 609 may generate an internal row address strobe signal RAS of positive logic. RX generating circuit 511 includes an inverter circuit 610 which inverts internal row address strobe signal /RAS, an n-channel MOS transistor NT20 which is responsive to an output of inverter circuit 610 to charge an output node NO to the operating power supply potential VCC level, a delay circuit 611 which delays internal row address strobe signal /RAS by a predetermined time, and an n-channel MOS transistor NT21 which is responsive to an output of delay circuit 611 to discharge output node NO to the ground potential. In place of inverter circuit 610 and n-channel MOS transistor NT2, an p-channel MOS transistor which receives internal row address strobe signal /RAS at its gate may be used.

Transistor NT20 has a current supply capability larger than that of transistor NT21. When the signal /RAS falls to the low level, i.e., active state, transistor NT20 becomes conductive, and thus output node NO is charged to supply voltage VCC level, i.e., high level. After a predetermined time period, n-channel MOS transistor NT21 is turned off. When signal /RAS rises to the high level, i.e., inactive state, transistor NT20 is turned off. At this time, the output of delay circuit 611 is still at the low level and transistor NT21 is in the off-state. In this condition, therefore, output node NO still maintains the high level. After a predetermined time period, the output of delay circuit 611 goes to the high level and transistor NT21 is turned on, so that output node NO is discharged to the ground potential level, i.e., low level, because transistor NT20 is off.

Boosting circuit 512 includes a delay circuit 612 which delays the output of RX generating circuit 511 by a predetermined time period, and a boosting capacitance 613 which is responsive to the output of delay circuit 612 to boost up the word line drive signal RX. Delay circuit 612 includes an even number of cascaded inverter circuits IV. Capacitor 613 further boosts up the high level potential of word line drive signal RX by its capacitance-coupling.

Row address decoder 503 includes row decoder circuits 603, each of which is disposed correspondingly to the word line. A row decoder circuit 603 is selected to generate a row selection signal at the high level when the applied internal address signals have a predetermined combination of logical values "0" and "1".

Word driver 504 includes drive circuits 604, each of which is disposed corresponding to the word line. Each drive circuit 604 includes an n-channel MOS transistor NT30 which is responsive to an output of row decoder circuit 603 to transfer word line drive signal RX to a corresponding word line WL, and an n-channel MOS transistor NT31 which is responsive to a reset signal (which is generally generated in response to internal row address strobe signal /RAS through a generating path (not shown)) to discharge the potential of word line WL to the ground potential. If word line drive signal RX is boosted up to or above the operating power supply potential, the gate potential of transistor NT30 is boosted up, due to the capacitance-coupling between the gate and drain and between the gate and source, to the level equal to or higher than the boosted level of the word line drive signal. Thereby, the boosted word line drive signal RX is transferred through transistor NT30 to word line WL. Then, an operation of the semiconductor memory device shown in FIGS. 1–3 will be briefly described below with reference to the operation waveform diagrams of FIGS. 4(a) to 4(f).

When external row address strobe signal *RAS falls to the low level, the semiconductor memory device enters the memory cycle. In response to the falling of signal *RAS, precharging/equalizing signal $\phi$PR falls to the low level. The generating path for signal $\phi$PR is not shown. Responsively, precharging/equalizing circuit PE is inactivated, and transistors NT1–NT3 are turned off. Bit lines BL and /BL are brought to the floating state at precharge potential VBL (generally at the level of VCC/2). Then, word line drive signal generating circuit 505 generates word line drive signal RX, which is further boosted up by boosting circuit 512 to the level equal to or above operating power supply voltage VCC level.

Meanwhile, address buffer 502 strobes and latches applied address signals A0–An to generate internal row address signals. Row address decoder 503 decodes the internal row address signals, whereby a row decoder circuit 603 and a drive circuit 504 are selected. Word line drive signal RX supplied from word line drive signal generating circuit 505 is transferred through drive circuit 504 to the corresponding word line WL.

When the potential of word line WL (assuming that word line WL1 is selected) rises, transistor NT4 of memory cell MC1 is turned on, and thus the charges accumulated in capacitor C1 are transferred to bit line BL. If memory cell MC1 has stored the information of "0", the potential of bit line BL lowers slightly below the precharge potential, as shown in FIG. 4(f). Bit line /BL maintains precharge potential VBL.

Then, sense amplifier activation signal generating circuit 510 generates sense amplifier activation signals φSN and/φSP to activate sense amplifier activating circuit 514, and thus sense amplifiers PSA and NSA operate.

Consequently, a slight potential difference generated between bit lines BL and /BL is amplified, so that the potential of bit line BL goes to the ground potential level and the potential of bit line /BL goes to operating power supply voltage VCC level.

Then, externally applied column address strobe signal *CAS goes to the active state, and address buffer 502 generates the internal column address signals, which are applied to column address decoder 506. Column address decoder 506 decodes the applied internal address signals to generate column selecting signal Yi which selects the corresponding column in memory cell array 501. Thereby, bit lines BL and /BL are connected through IO gate IOG to internal data lines DB and /DB, respectively.

In the data write operation, write instructing signal /WE is in the active state, i.e., at the low level. I/O circuit 508 transfers the internal write data to internal data lines DB and /DB, which are then transferred to corresponding bit lines BL and /BL and the data is written in memory cell MC1.

In the data read operation, the potentials of bit lines BL and /BL are transferred to internal data lines DB and /DB, and then are transferred to I/O circuit 508, by which external read data D/Q is formed. The write timing in the data write operation is determined by the control signals *CAS and *WE. Generally, when both signals *CAS and *WE are at the low level of the active state, the external write data is captured, and the internal write data is produced and transferred to internal data lines DB and /DB.

As shown in FIG. 2, the dynamic memory cell includes one MOS transistor and one capacitor. The MOS transistor allows the passage of a voltage Vg–Vth which is less than its gate voltage Vg by a threshold voltage Vth. When the potential of word line WL is at supply voltage VCC level, the signal at a VCC–Vth level is transferred to the memory cell capacitor, even if the potential of the bit line is at the high level of supply voltage VCC level.

In the word line selecting operation, the signal charges accumulated in the memory cell capacitor are transferred to the corresponding bit line. Precharge potential VBL is generally VCC/2. The low level of the bit line is the ground potential level. Therefore, the high level and the low level of the read voltage on the bit line (i.e., the voltage appearing on the bit line before the operation of the sense amplifier) become asymmetric with respect to the precharge voltage, resulting in a poor operating margin of the sense amplifier.

For this reason, the potential of the selected word line is boosted up to or above VCC+Vth in order to store the signal at the VCC level in the memory cell capacitor without a loss. This enables the high level data to be stored in the memory cell capacitor without a signal loss. Thereby, the read voltage at the high level having a sufficient value can be obtained, and the read voltage at the high level and the read voltage at the low level can be symmetric with respect to the precharge potential, so that the sense amplifier can reliably carries out the sense operation without malfunction.

Due to the boosting of word line drive signal RX to or above VCC, the rising speed of the word line potential increases, and thus the memory cell data can be read to the bit line at a high speed. Thereby, the timing for activating the sense amplifier can be set earlier, and thus the access time can be reduced.

In order to boost up word line drive signal RX, a word line drive signal generating circuit, e.g., as shown in FIG. 3 is used. The boosting circuit in the word line drive signal generating circuit applies a delay signal of the word line drive signal to one of the electrodes of a capacitor 613, so that the potential of the other electrode of capacitor 613 is boosted up through the capacitance-coupling, and thus the high level of word line drive signal RX is boosted up to the level equal to or above operating power supply voltage VCC.

In the construction shown in FIG. 3, the potential level of word line drive signal RX is always boosted up to or above operating power supply voltage VCC, while external row address strobe signal *RAS is in the low level and the semiconductor memory device is in the memory cycle. As the dynamic type semiconductor memory device is integrated to a higher degree, elements thereof have smaller sizes. In this case, the reliability of the word line becomes a matter of concern. If the thickness of the gate insulating film under the word line decreases in accordance with the miniaturization of the elements, and a high voltage is applied to the word line, the gate insulating film is likely to cause a dielectric breakdown. The miniaturization of the elements also reduces the line width of the word line, and thus the word line itself may be destructed due to electron migration, stress migration or the like caused by this high voltage.

In some operation modes such as a page mode and a static column mode of the semiconductor memory device, external row address strobe signal *RAS stays in the active state for an extremely long cycle time period. In such a long tRAS (a time period for which signal RAS is in the active state) period, in which the operation cycle of the device is extremely long, the voltage at the boosted level is continuously applied to the word line during this long cycle period. If the boosted voltage is applied to the word line for a long time period, the breakdown voltage of the word line is likely to be reduced, resulting in low reliability of the word line.

SUMMARY OF THE INVENTION

An object of the invention is to provide a dynamic semiconductor memory device having a word line of a high reliability.

Another object of the invention is to provide an operating method of a dynamic semiconductor memory device enhancing a reliability of a word line.

A dynamic semiconductor memory device according to the invention includes word line drive signal generating circuitry for generating a word line drive signal to be transferred onto a selected word line, determination circuitry responsive to a signal other than the word line drive signal for determining whether a level of the word line drive signal generated by the word line drive signal generating circuitry should be boosted up, and boosting circuitry responsive to the generated word line drive signal and an output of the determination circuitry for further boosting up the generated word line drive signal.

The determination circuitry determines whether the word line drive signal should be boosted up, and the boosting circuitry boosts up the word line drive signal in accordance with a result of determination of the determination circuitry. Accordingly, the word line drive signal is boosted up only for a necessary period, and thus a high voltage is not continuously applied to the word line, so that the reliability of the word line is improved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 7(a) to 7(c) are signal waveform diagrams showing an operation of the word line drive signal generating circuit shown in FIG. 6;

FIG. 8 shows another example of a construction of a word line drive signal generating circuit according to the invention;

FIGS. 9A(a) to 9A(c) and 9B(a) to 9B(c) are signal waveform diagrams showing an operation of the word line drive signal generating circuit shown in FIG. 8;

FIGS. 10(a) and 10(b) are signal waveform diagrams schematically showing an operation of a word line drive signal generating circuit of still another embodiment of the invention;

FIG. 11 shows a construction of a boosting circuit used in a word line drive signal generating circuit achieving an operation waveform shown in FIG. 10;

FIGS. 15(a) to 15(f) are signal waveform diagrams showing an operation of the boosting circuit shown in FIG. 11.

DESCRIPTION OF THE PREFERRED EMBODIMENT

Figure 1:
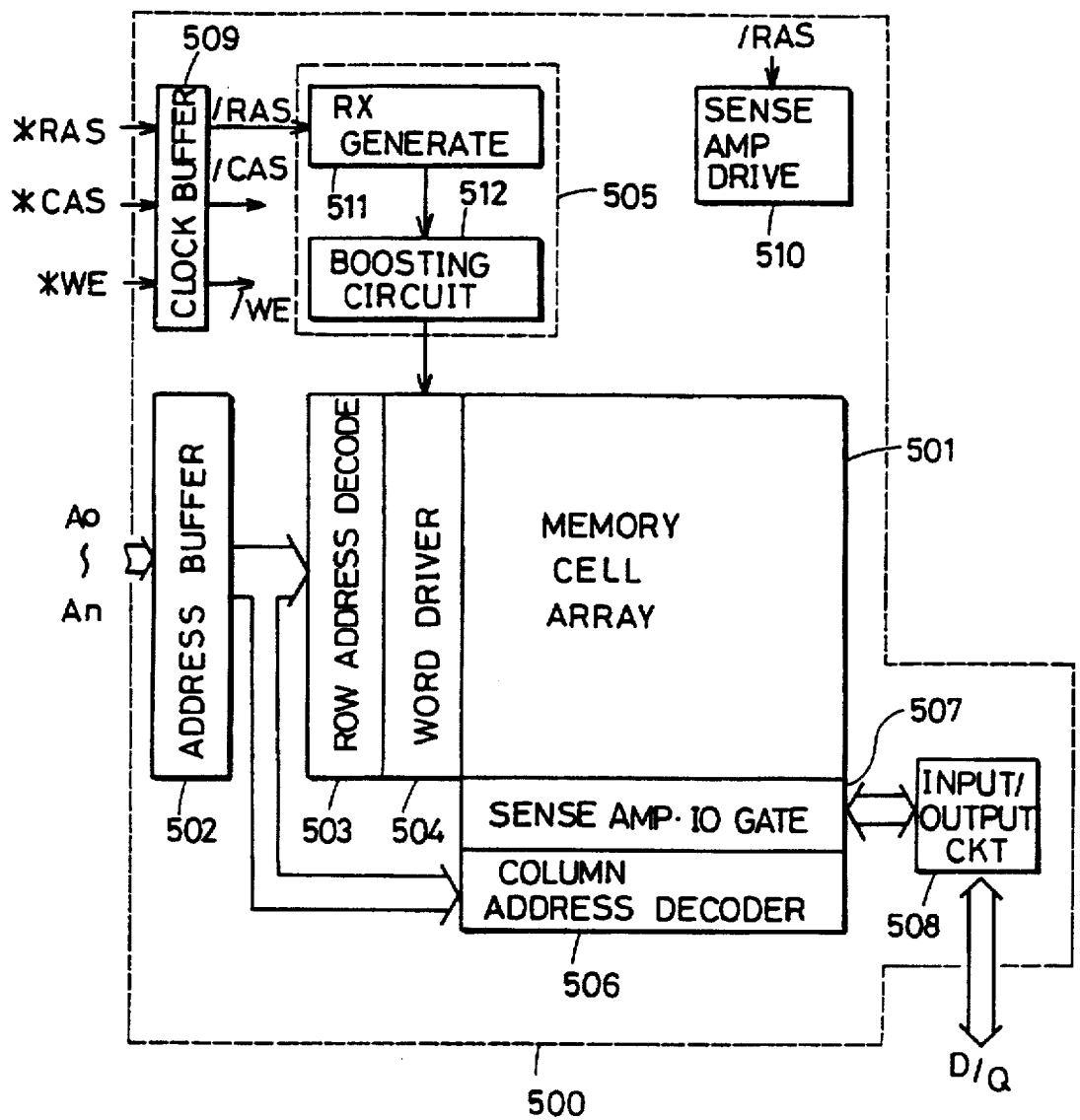
FIG. 1 schematically shows an overall construction of a dynamic semiconductor memory device in the prior art.
Figure 2:
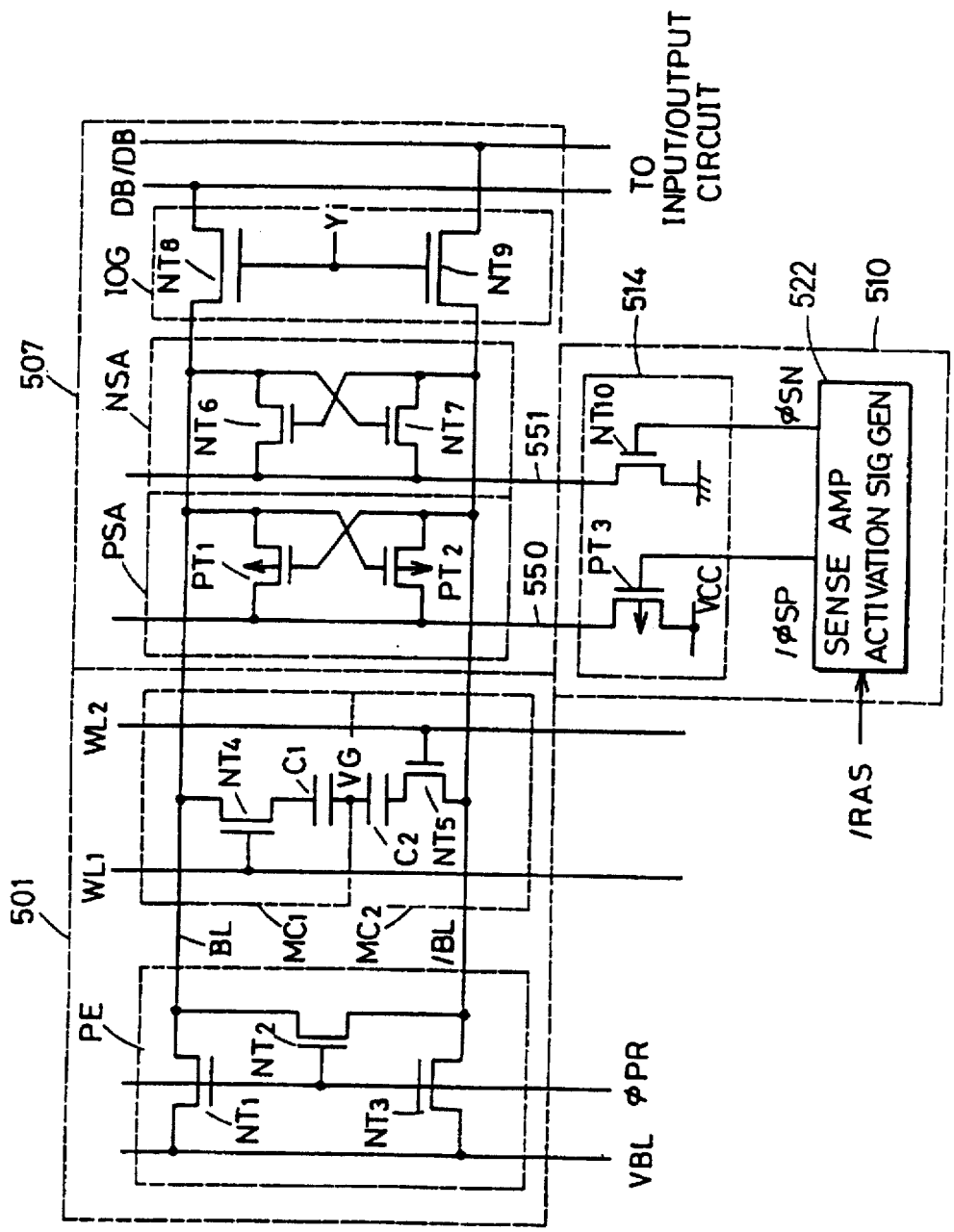
FIG. 2 shows a specific construction of a memory cell array and a sense amplifier as well as IO gate block shown in FIG. 1.
Figure 3:
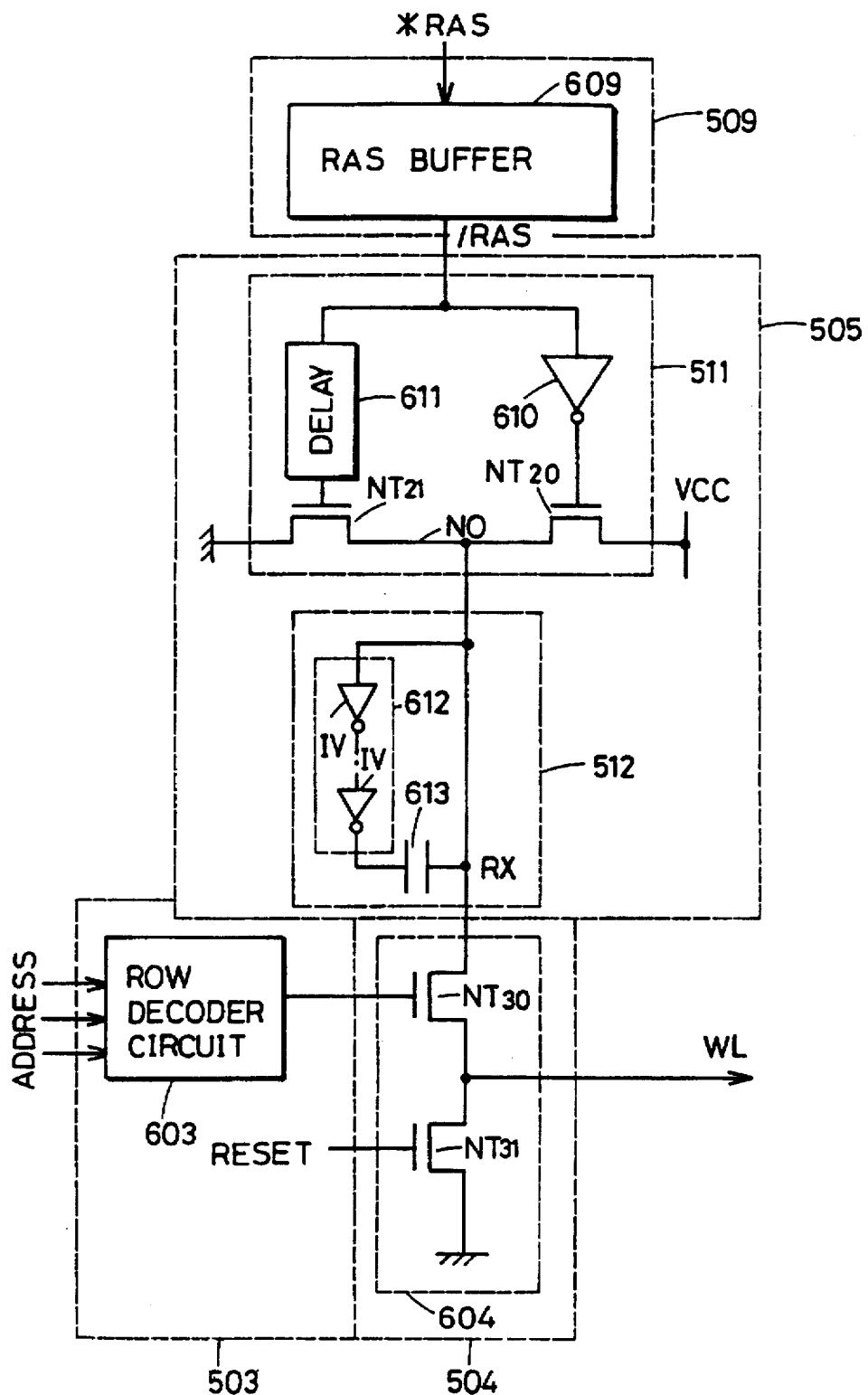
FIG. 3 shows a specific construction of a clock buffer and a word line drive signal generating circuit.
Figure 4:
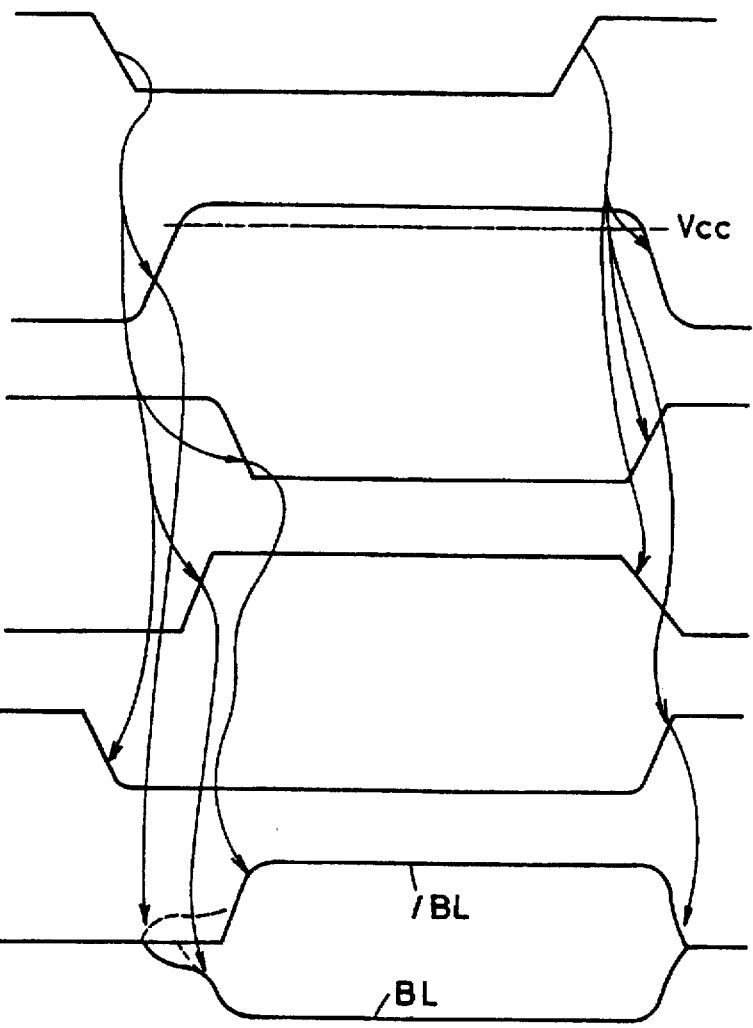
FIGS. 4(a) to 4(f) are signal waveform diagrams showing an operation of the dynamic semiconductor memory device shown in FIGS. 1–3.
Figure 5:
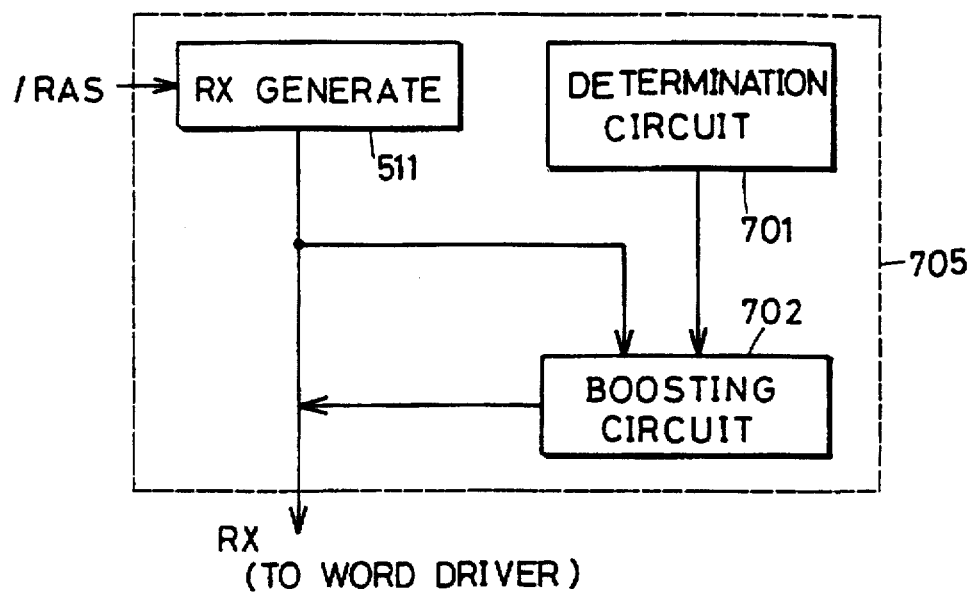
FIG. 5 schematically shows a construction of a word line drive signal generating circuit used in a dynamic semiconductor memory device according to the invention.

FIG. 5 schematically shows a construction of a word line drive signal generating circuit used in a dynamic semiconductor memory device according to the invention. A word line drive signal generating circuit 705 shown in FIG. 5 may be applied to the dynamic semiconductor memory device shown in FIGS. 1 and 2. Word line drive signal generating circuit 705 shown in FIG. 5 can be used in place of word line drive signal generating circuit 505 shown in FIGS. 1 and 3.

In FIG. 5, word line drive signal generating circuit 705 includes an RX generating circuit 511 responsive to internal row address strobe signal /RAS for generating word line drive signal RX, determination circuit 701 responsive to a signal other than word line drive signal RX for determining whether the level of word line drive signal RX should be further boosted up, and a boosting circuit 702 responsive to an output of determination circuit 701 and word line drive signal RX for further boosting word line drive signal RX. Determination circuit 701 determines whether word line drive signal RX should be boosted up in accordance with the supply voltage level or the external control signal.

Boosting circuit 702 boosts up the word line drive signal RX only when determination circuit 701 determines that the word line drive signal should be boosted up. Therefore, word line drive signal RX is boosted up to or above operating power supply voltage VCC only when it is necessary. Thereby, an excessive voltage is not applied unduly to the word line, so that the reliability of the word line is improved.

Figure 6:
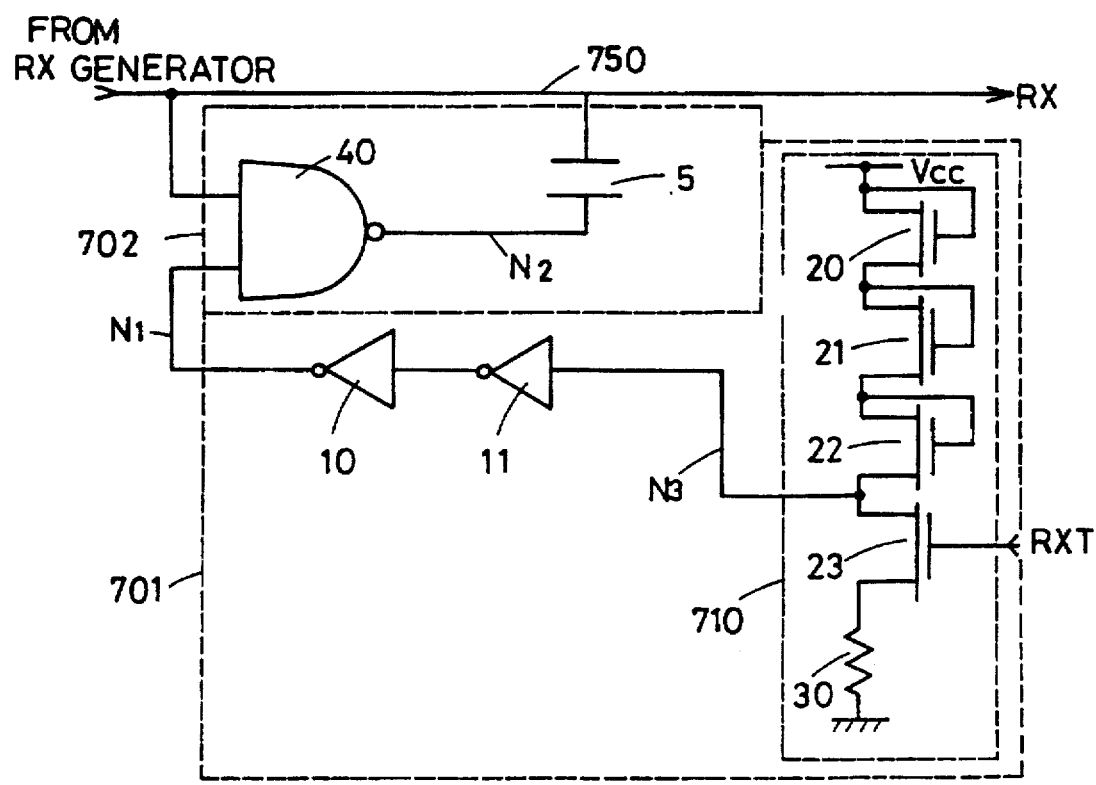
FIG. 6 shows a specific construction of a word line drive signal generating circuit of the invention.
Figure 12:
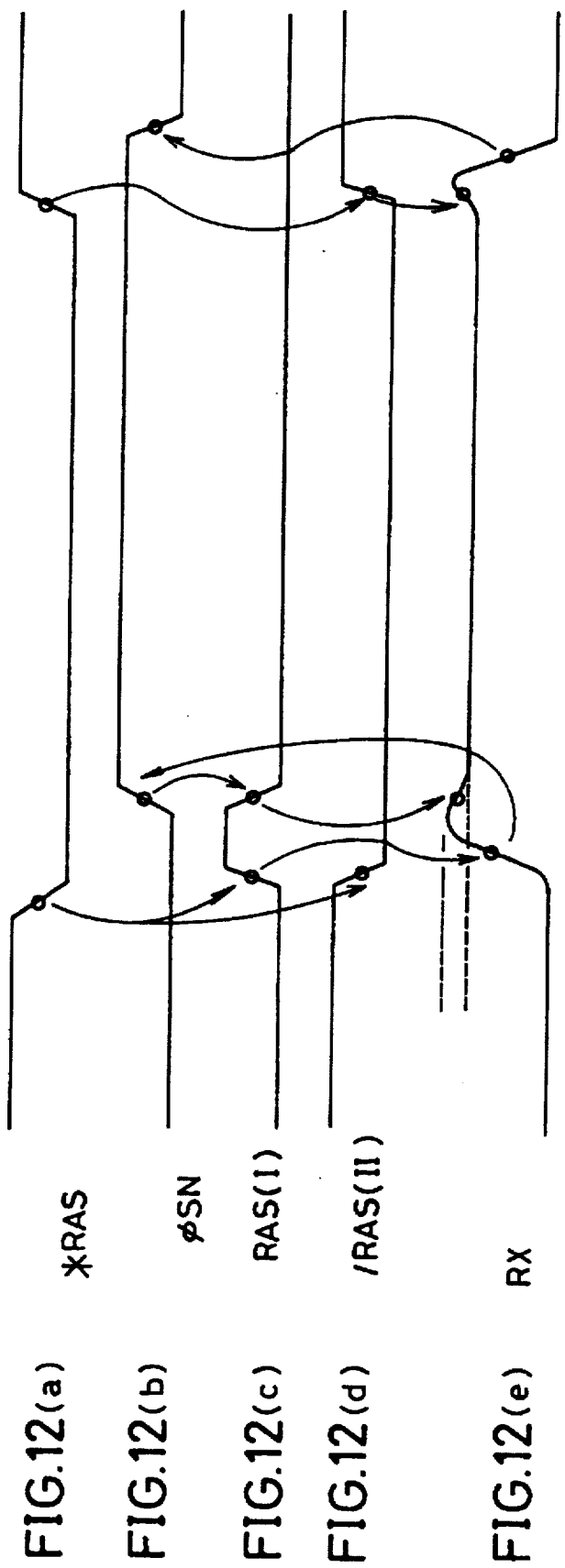
FIGS. 12(a) to 12(e) are signal waveform diagrams showing an operation of a boosting circuit shown in FIG. 11.

FIG. 6 shows a specific construction of a word line drive signal generating circuit used in the dynamic semiconductor memory device according to the invention. FIG. 6 shows the constructions of determination circuit 701 and boosting circuit 702. Determination circuit 701 includes a potential detecting circuit 710 for detecting the level of operating power supply voltage VCC, and two inverter circuits 10 and 11 which are cascaded and are responsive to an output of potential detecting circuit 710 for determining whether word line drive signal RX should be boosted.

Potential detecting circuit 710 includes diode-connected n-channel MOS transistors 20, 21 and 22 which are connected in series between operating power supply potential VCC and a node N3, an n-channel MOS transistor 23 which is turned on in response to a trigger signal RXT, and a resistor 30 interposed between transistor 23 and the ground potential. The resistance of resistor 30 is larger than on-resistance of transistors 20–22. When transistor 23 is turned on by trigger signal RXT, the current flows through potential detecting circuit 710 and the potential of node N3 goes to VCC–3Vth. Vth is threshold voltages of transistors 20–22. Inverter circuit 11 inverts and amplifies the signal potential of node N3. Inverter circuit 10 inverts and amplifies the output of inverter circuit 10.

Boosting circuit 702 includes an NAND circuit 40 receiving the output of determination circuit 701 and word line drive signal RX supplied from RX generating circuit 511, and a boosting capacitance 5 responsive to an output of NAND circuit 40 for boosting up the word line drive signal RX transmitted onto a signal line 750. The output of NAND circuit 40 is at the low level only when both the inputs thereof are at the high level.

Trigger signal RXT is a signal for triggering the generation of word line drive signal RX, and is activated at a timing earlier than that for word line drive signal RX. Specifically, in RX generating circuit 511, trigger signal RXT is first generated in response to internal row address strobe signal /RAS, and then word line drive signal RX is generated in response to trigger signal RXT. In order to generate the signal RXT, the construction, e.g., shown in FIG. 3 may be provided with a buffer circuit located upstream to inverter circuit 610 and delay circuit 611, and trigger signal RXT may be generated from a stage upstream to this buffer circuit. Now, an operation of a word line drive signal generating circuit shown in FIG. 6 will be described below with reference to the operation waveform diagrams of FIGS. 7(a) to 7(c).

First, an operation in a case that operating power supply voltage VCC is a predetermined voltage (e.g., 5.5V) or more will be described. When external row address strobe signal *RAS falls to the low level, RX generating circuit 511 generates trigger signal RXT, and potential detecting circuit 710 is activated. Thereby, the potential of node N3 goes to VCC–3Vth. Since operating power supply voltage VCC is the predetermined voltage (5.5V) or more, the potential of node N3 is determined to be at the high level by inverter circuit 11, and the output of inverter circuit 11 goes to the low level. Then, the output of inverter circuit 10 goes to the high level.

RX generating circuit 511 generates word line drive signal RX following trigger signal RXT. When word line drive signal RX rises to the high level, the output of NAND circuit 40 goes to the low level because both outputs of the NAND circuit 40 are at the high level. Therefore, boosting capacitance 5 does not carry out the boosting, and word line drive signal RX transferred onto signal line 750 is at supply voltage VCC level (see FIG. 7(c)II.

Now, an operation in a case that operating power supply voltage VCC is less than the predetermined voltage will be described below (see FIG. 7(c)I. Potential VCC–3Vth of node N3 is determined to be at the low level by inverter circuit 11, and the output of inverter circuit 11 goes to the high level. Correspondingly, the output of inverter circuit 10 goes to the low level. RX generating circuit 511 generates word line drive signal RX. In this time, if the delay time by inverter circuits 10 and 11 is determined such that RX generating circuit 511 generates word line drive signals RX before the high/low of the output of inverter circuit 10 is determined, word line drive signal RX transferred onto signal line 750 is boosted up to or above operating power supply voltage VCC level in accordance with the outputs of inverter circuit 10 and NAND circuit 40. The boosted level of word line drive signal RX is determined by a ratio of the capacitance of boosting capacitance 5 and a stray capacitance associated with signal line 750.

After signals RXT and RX are generated, the potentials of nodes N1 and N2 become definitive. The definition timing of the potential of node N3 may precede or follow the generating timing of signal RX if the foregoing conditions are satisfied. The potential of node N2 is at the high level of VCC level before the generation of signal RXT. Node N2 which was at the high level before the generation of signal RX temporarily falls to the low level due to the signal RX.

As described above, the level of supply voltage VCC is monitored and word line drive signal RX is selectively boosted up in accordance with the level of supply voltage VCC. Thereby, the excessive voltage is not unnecessarily applied to the word line when supply voltage VCC is the high voltage, so that the reliability of the word line is improved.

For example, if the normal operating power supply voltage of the semiconductor memory device is set in a wide range from 1.6V to 3.6V, the maximum rated voltage is set at a value of about 5.5V. This is one of tendencies in the reduction of the operating power supply voltage in recent years. If the word line is boosted up when a voltage above the maximum rated voltage level is applied to the semiconductor memory device, an excessive voltage may be applied to the word line, which impairs the reliability thereof. In this case, if the construction shown in the FIG. 6 is employed, the word line is not boosted up when the operating power supply voltage VCC is 5.5V or more. If the operating power supply voltage is 5.5V or more, word line drive signal RX is at the level of a sufficiently high voltage, so that the potential of the word line rapidly rises, and the read voltage appearing on the bit line can surely has a sufficient large value. Accordingly, even if the word line drive signal is not boosted up, the sensing operation can be surely carried out without adversely effecting the activating timing of the sense amplifier, and thus the access delay is not caused.

In the circuit construction shown in FIG. 6, the word line drive signal is not boosted up when operating power supply voltage VCC has the predetermined value or more, e.g., of 5.5V. For the semiconductor memory device, an acceleration test such as a burn-in test is carried out. In the burn-in test, the semiconductor memory device is operated under a circumstance of a high voltage and a high temperature to remove initial defect due to particles or the like by revealing latent defect, whereby potentially defective product is repaired. In the burn-in test, it is necessary to intentionally deteriorate the breakdown voltage of the word line. Therefore, if operating power supply voltage VCC is made high in such burn-in test, it is necessary to boost up the word line. Then, a construction for selectively boosting up the word line to or above the operating power supply voltage level also in such high voltage operation will be described below.

FIG. 8 shows a construction of the word line drive signal generating circuit according to another embodiment of the invention.

In FIG. 8, determination circuit 701 includes, in addition to potential detecting circuit 710 and inverter circuits 10 and 11, a burn-in mode detecting circuit 801 responsive to an externally applied burn-in test designating signal *BI for detecting the designation of the burn-in test. Burn-in mode detecting circuit 801 is responsive to externally applied burn-in mode designating signal *BI for producing internal control signals BI and /BI. Burn-in mode detecting circuit 801 may be designed so that it merely detects the designation of the burn-in test when a predetermined terminal is set at a voltage equal to or above the voltage for a normal operation. Alternatively, burn-in mode detecting circuit 801 may be designed so that designation of the burn-in test mode is detected based on the combination of the timings of external control signals (e.g., *RAS, *CAS and *WE). In any construction, burn-in mode detecting circuit 801 is responsive to the external control signals to detect the designation of the burn-in test, and produces internal control signals BI and /BI indicating the result of this detection. Boosting circuit 702 includes an n-channel MOS transistor 24 responsive to internal control signal /BI for electrically connecting the output of NAND circuit 40 and one electrode of a boosting capacitance 5b, an n-channel MOS transistor 25 responsive to internal control signal BI for transferring word line drive signal RX on signal line 750, a delay circuit 50 delaying an output of transistor 25 by a predetermined time, and a boosting capacitor 5a responsive to an output of delay circuit 50 for further boosting up word line drive signal RX on signal line 750.

Internal control signals BI and /BI are at the high level and the low level in the burn-in test mode, and are in the low level and the high level in the normal operation mode, respectively. Then, an operation of the word line drive signal generating circuit shown in FIG. 8 will be described below with reference to an operation waveform diagram of FIGS. 9A and 9B. First, an operation when the burn-in mode is designated will be described below with reference to FIGS. 9A(a) to 9A(c).

When the acceleration test (burn-in test) mode is designated, internal control signal BI goes to the high level. Thereby, transistor 25 is turned on, and transistor 24 is turned off.

When external row address strobe signal *RAS goes the active state of low level, RX generating circuit generates word line drive signal RX. Word line drive signal RX is applied to delay circuit 50 through transistor 25. The level of word line drive signal RX on signal line 750 is further boosted up by boosting capacitance 5a to or above operating power supply voltage VCC.

Since transistor 24 is in the off-state, the output of NAND circuit 40 is not transferred to boosting capacitance 5b.

Therefore, the output of determination circuit 701 is neglected, and thus word line drive signal RX is boosted up in the burn-in test mode, regardless of the level of operating power supply voltage VCC.

In the normal operation mode, internal control signal BI is in the low level, as shown in FIGS. 9B(a) to 9B(c). In this case, transistor 25 is in the off-state, and transistor 24 is in the on-state. Word line drive signal RX is not transferred to the delay circuit 50, and boosting capacitance 5a does not carry out the boosting operation. Therefore, in this normal operation mode, the boosting operation of word line drive signal RX is selectively carried out in accordance with the output of determination circuit 701, i.e., the level of operating power supply voltage VCC because transistor 24 is in the on-state.

In the construction shown in FIG. 8, the burn-in test is carried out by boosting up the word line regardless of the operating power supply voltage level. The construction shown in FIG. 8 may be employed not only in the acceleration test such as burn-test but also in such a case that it is necessary to boost up the word line to or above the operating power supply voltage level regardless of the level of the supply voltage VCC.

When word line drive signal RX is boosted up by the construction shown in FIGS. 6, 10(a) and 10(b), the time period for the boosting up substantially coincides with the time period for which internal row address strobe signal /RAS is at the low level. In the long cycle such as a page mode or static column mode, a high voltage is applied to the word line for a long time.

The boosting up of the potential level of the word line is particularly required for a time period from the selection of a word line to the operation of the sense amplifier for obtaining a sufficient large read voltage at a high speed, and for a restoring period for writing the data read to the bit line in the memory cell again. Specifically, the boosting up of the potential level of the word line is required, as shown in FIG. 10(b), for a predetermined period T1 in which external control signal *RAS falls, and for a predetermined period T2 in which external row address strobe signal *RAS rises. The period T1 may be terminated before the start of the sensing operation by the sense amplifier, or may be terminated when the sense amplifier completes the sensing operation for sufficiently amplifying the potential difference between the bit lines.

FIG. 11 shows a construction of the boosting circuit in the word line drive signal generating circuit according to still another embodiment of the invention. Boosting circuit 702 shown in FIG. 11 includes an NAND circuit 40a receiving internal control signal RAS(I) and word line drive signal. RX on signal line 750, an inverter circuit 10a receiving an output of NAND circuit 40a, a delay circuit 50a delaying an output of inverter circuit 10a by a predetermined time, and a boosting capacitance 5a responsive to an output of delay circuit 50a for boosting up word line drive signal RX on signal line 750. Internal control signal RAS(I) is set at the high level in response to the falling of external row address strobe signal *RAS, and is reset to the low level in response to the sense amplifier activation signal φSN. The path of circuits 40a, 10a and 50a and boosting capacitance 5a boosts up word line drive signal RX for a period from the fall of external row address strobe signal *RAS to the sensing operation.

Boosting circuit 702 further includes an NAND circuit 40b receiving internal control signal /RAS(II) and word line drive signal RX on signal line 750, an inverter circuit 10b receiving an output of NAND circuit 40b, a delay circuit 50b for delaying an output of inverter circuit 10b by a predetermined time, and a boosting capacitance 5b responsive to an output of delay circuit 50b for boosting up word line drive signal RX on signal line 750. Internal control signal /RAS (II) is set at the low level in response to the fall of external row address strobe signal *RAS, and is reset at the high level in response to the rise of external row address strobe signal *RAS. The path of circuits 40b, 10b and 50b and capacitance 5b boosts up word line drive signal RX for a predetermined period in which external row address strobe signal *RAS rises.

In the construction shown in FIG. 11, if NAND circuit 40 and inverter circuit 10 on the same path provide a sufficiently long delay time, delay circuits 50a and 50b may be eliminated. An operation of the boosting circuit shown in FIG. 7 will be described below with reference to the operation waveform diagrams of FIGS. 12(a) to 12(e).

When external row address strobe signal *RAS falls to the low level, internal control signal RAS(I) rises to the high level, and internal control signal /RAS(II) falls to the low level. Then, in response to the fall of external row address strobe signal *RAS to the low level, the RX generating circuit generates word line drive signal RX. Responsively, the output of NAND circuit 40a falls to the low level, and the level of word line drive signal RX on signal line 750 is boosted up to or above supply voltage VCC level through inverter circuit 10a and delay circuit 50a.

When a predetermined time elapses after the word line selecting operation, sense amplifier activation signal φSN is generated from the sense amplifier drive circuit in response to the transition of external row address strobe signal *RAS to the low level. Thereby, the sensing operation is carried out in the bit line pair.

When sense amplifier activation signal φSN rises to the high level, internal control signal RAS(I) falls to the low level, and the level of word line drive signal RX on signal line 750 falls to power supply voltage level VCC level due to the capacitance coupling through boosting capacitance 5a. After the execution of the write or read of the data, external control signal *PAS rises to the high level. In response to the rise of external row address strobe signal *RAS, internal control signal /RAS(II) rises to the high level, and the output of NAND circuit 40b falls to the low level. Responsively, word line drive signal RX on signal line 750 is boosted up to or above supply voltage VCC level through inverter circuit 10b, delay circuit 50b and boosting capacitance 5b. During this operation, the restoring operation for each memory cell is carried out. After word line drive signal RX falls to the low level, sense amplifier activation signal φSN falls to the low level Thereby, one memory cycle is completed.

Figure 13:
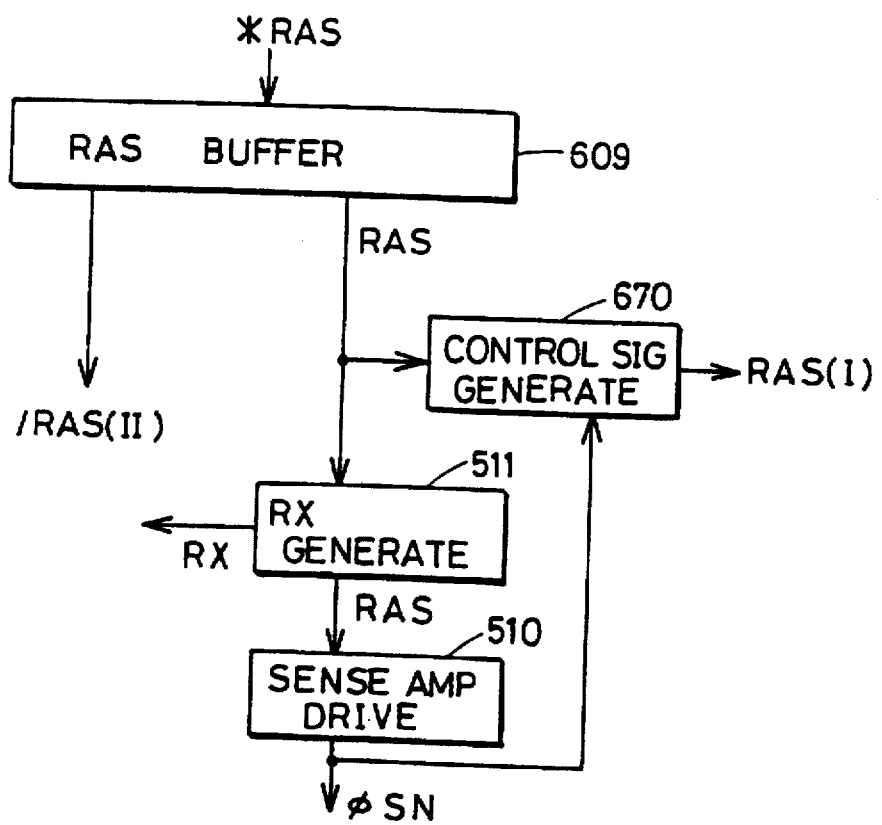
FIG. 13 shows a construction of a determination circuit used in combination with a boosting circuit shown in FIG. 11.

FIGS. 13 shows a circuit construction for generating internal control signals /RAS(II) and RAS(I). Internal control signal /RAS(II) is generated from RAS buffer 609. RAS buffer 609 carries out a buffer processing on external row address strobe signal *RAS to generate internal control signal /RAS(II). RAS buffer 609 also carries out the buffer processing of external row address strobe signal *RAS to generate internal control signal RAS. Internal control signal RAS is a signal complementary with internal control signal /RAS(II).

Internal control signal RAS(I) is generated from a control signal generating circuit 670. Control signal generating circuit 670 is formed of, e.g., an AND circuit which receives, at its true input, internal control signal RAS from RAS buffer 609 and also receives, at its false input, sense amplifier activation signal φSN from sense amplifier drive circuit 510. Sense amplifier drive circuit 510 is responsive to internal control signal RAS supplied from RAS buffer 609 and generates sense amplifier activation signal φSN when a predetermined time elapses after RX generating circuit 511 generated word line drive signal RX.

In the construction shown in FIG. 13, control signal generating circuit 670 may be constructed to receive p-channel sense amplifier activation signal φSP, in place of sense amplifier activation signal φSN supplied from sense amplifier drive circuit 510. Control signal generating circuit 670 generates internal control signal RAS(I) in response to sense amplifier activation signal φSN. The rising timing of internal control signal RAS(I) may precede or follow the completion of the sense operation. In the construction shown in FIG. 13, the determination circuit is formed of RAS buffer 609 and control signal generating circuit 670.

Figure 14:
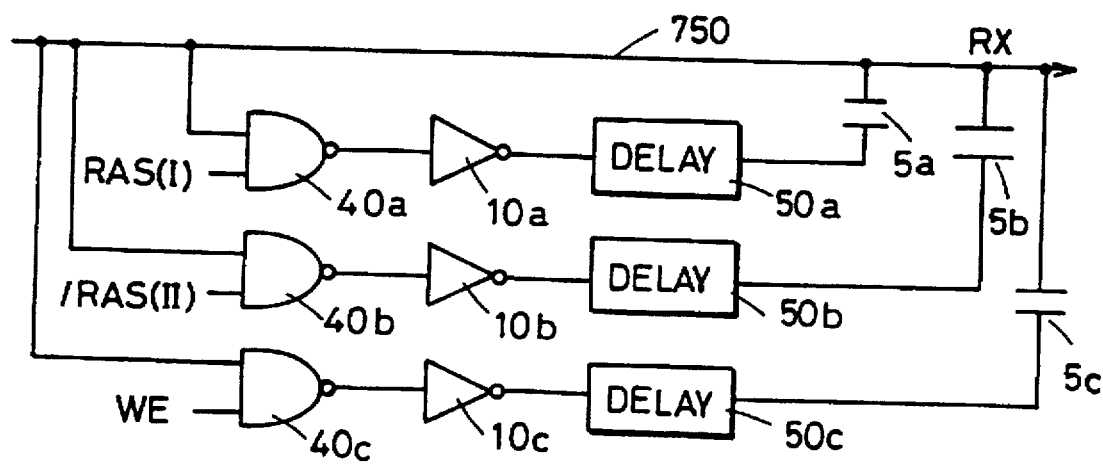
FIG. 14 shows a construction of a boosting circuit in a word line drive signal generating circuit of yet another embodiment of the invention.

FIG. 14 shows a construction of the boosting circuit according to yet another embodiment of the invention. The boosting circuit shown in FIG. 14 includes, in addition to the components of the boosting circuit shown in FIG. 11, an NAND circuit 40c receiving word line drive signal RX on signal line 750 and write enable signal WE, inverter circuit 10c receiving an output of NAND circuit 40c, a delay circuit 50c receiving an output of inverter circuit 10c, and a boosting capacitance 5c responsive to an output of delay circuit 50c for boosting up word line drive signal RX on signal line 750.

In the construction shown in FIG. 14, when internal write enable signal WE is generated, the level of word line drive signal RX is boosted up. When the write enable signal WE is activated, the write circuit (508 in FIG. 1) generates the internal write data, which is transferred to internal data buses DB and /DB shown in FIG. 2. Then, the internal write data is transferred through selected IO gate IOG to a selected bit line pair. Write enable signal WE may be generated in response to externally applied write enable signal *WE, or may be formed of an one-shot pulse signal generated in the semiconductor memory device at a predetermined timing. Although the operation depends on the generating timing of write enable signal WE, the boosting circuit constructed as shown in FIG. 14 operates in such a manner that, as shown in the operation waveform diagram of FIGS. 15(a) to 15(f), word line drive signal RX is boosted up to or above the supply voltage level in response to write enable signal WE, and the boosted level is further boosted up in response to internal control signal /RAS(II). Thereby, the signal at the high level of supply voltage VCC level can be written more reliably in the selected memory cell.

In the foregoing dynamic semiconductor memory device, the address signals have been described to be applied in a time division multiplexed manner, and the external row address strobe signal is used as the memory cycle specifying signal. However, if the row address signal and the column address signal are applied in parallel, memory cycle is determined by chip select signal *CS. In this case, chip select signal *CS is used in place of external row address strobe signal *RAS described before. An address change detection signal ATD may be used in place of signal *RAS.

The dynamic semiconductor memory device may be a semiconductor memory device, other than the DRAM (dynamic random access memory), such as a virtual static random access memory (VSRAM) or a pseudo static random access memory (PSRAM). The invention can be applied to an semiconductor memory device in which the potential of the word line is boosted up to or above the operating power supply voltage level during the memory access. Both the pseudo static RAM and the virtual static RAM have the same construction as the DRAM, i.e., the construction of one-transistor/one-memory cell, but they operate in such a manner that the address signal is applied in a non-multiplex manner. The pseudo static RAM contains internally a refresh address counter, and carries out the refresh in accordance with a refresh instruction during the operation. During standby, external refresh control is not carried out, and the refresh is internally carried out. The virtual static RAM internally carries out the refresh control in any cases.

According to the invention, as described hereinabove, the operating power supply voltage level or the externally applied signal acts to selectively boost up the word line drive signal, so that the word line is not unnecessarily maintained at the high voltage. Therefore, the breakdown voltage of the word line is not deteriorated, and the semiconductor memory device having a high reliability can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device including a plurality of word lines each having a row of memory cells connected thereto, comprising:

word line drive signal generating means for generating a word line drive signal to be transferred onto a selected word line;

determination means responsive to a signal other than said word line drive signal for determining whether the word line drive signal should be completely inhibited from being boosted up; and boosting means responsive to said determination means for selectively boosting up the word line drive signal, wherein said determination means includes:

detecting means for detecting a level of potential supplied from an operating power supply of the semiconductor memory device, and decision means responsive to said detecting means for completely inhibiting the boosting up by said boosting means when the potential level is detected to be above a predetermined level.

2. A method of operating a semiconductor memory device including a plurality of word lines having memory cells connected thereto, comprising the steps of:

generating a word line drive signal to be transferred onto a selected word line at a first timing;

determining whether or not the word line drive signal should be further boosted up, in response to an indication other than said word line driving signal, and selectively boosting further up the word line drive signal, according to a result of determination in said step of determining, said step of determining including the steps of detecting a potential level of an operating power supply of the semiconductor memory device, and determining that the boosting up operation should not be effected when said potential level is above a predetermined potential level, to completely inhibit said boosting.

* * * * *